US010135029B2

(12) United States Patent
Kamiya (10) Patent No.: US 10,135,029 B2
(45) Date of Patent: Nov. 20, 2018

(54) DISPLAY DEVICE

(71) Applicant: Japan Display Inc., Minato-ku (JP)

(72) Inventor: Akinori Kamiya, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/408,925

(22) Filed: Jan. 18, 2017

(65) Prior Publication Data

US 2017/0250373 A1 Aug. 31, 2017

(30) Foreign Application Priority Data

Feb. 25, 2016 (JP) ................................ 2016-034588

(51) Int. Cl.
| | |
|---|---|
| *H01L 27/32* | (2006.01) |
| *H01L 51/52* | (2006.01) |
| *H01L 27/12* | (2006.01) |
| *H01L 51/56* | (2006.01) |

(52) U.S. Cl.
CPC ...... *H01L 51/5256* (2013.01); *H01L 27/3244* (2013.01); *H01L 27/1248* (2013.01); *H01L 27/1262* (2013.01); *H01L 51/56* (2013.01); *H01L 2251/301* (2013.01); *H01L 2251/303* (2013.01); *H01L 2251/5338* (2013.01)

(58) Field of Classification Search
CPC ........... H01L 51/5256; H01L 2251/301; H01L 2251/303; H01L 2251/5338; H01L 51/56; H01L 27/1248; H01L 27/1262
See application file for complete search history.

(56) References Cited

U.S. PATENT DOCUMENTS

| | | | | |
|---|---|---|---|---|
| 6,268,695 B1* | 7/2001 | Affinito | ............... | H01L 51/5256 313/504 |
| 6,570,325 B2* | 5/2003 | Graff | ................... | H01L 51/5256 313/502 |
| 7,612,498 B2* | 11/2009 | Sano | .................... | H01L 51/5256 313/506 |
| 7,741,769 B2* | 6/2010 | Hayashi | .............. | H01L 51/5246 313/498 |
| 7,804,240 B2* | 9/2010 | Shim | ...................... | H05B 33/04 313/504 |

(Continued)

FOREIGN PATENT DOCUMENTS

| | | |
|---|---|---|
| JP | 2000-223264 | 8/2000 |
| JP | 2004-63462 | 2/2004 |

(Continued)

*Primary Examiner* — Mary Wilczewski
(74) *Attorney, Agent, or Firm* — Oblon, McClelland, Maier & Neustadt, L.L.P.

(57) ABSTRACT

A display device includes: a light emitting element including a light emitting layer, and a first electrode and a second electrode that hold the light emitting layer therebetween; and a sealing layer on the light emitting element, wherein the sealing layer includes an organic layer, and a first inorganic layer and a second inorganic layer that hold the organic layer from an upper side and a lower side. A peripheral part of the first inorganic layer and a peripheral part of the second inorganic layer are connected around an outer perimeter of the organic layer and vertically overlap with each other so as not to cover an edge surface of each other's from a lateral side. At least one of the first inorganic layer and the second inorganic layer is an Aluminum Oxide film.

18 Claims, 6 Drawing Sheets

(56) References Cited

U.S. PATENT DOCUMENTS

| | | | |
|---|---|---|---|
| 8,169,132 B2* | 5/2012 | Oh | H01L 51/5256 257/100 |
| 8,552,634 B2* | 10/2013 | Kim | H01L 51/5271 313/504 |
| 8,569,951 B2* | 10/2013 | Ryu | H01L 51/5256 313/504 |
| 8,772,824 B2* | 7/2014 | Lee | H01L 27/00 257/100 |
| 9,257,674 B2* | 2/2016 | Lee | H01L 51/5256 |
| 9,490,450 B2* | 11/2016 | Kang | H01L 51/5256 |
| 9,681,501 B2* | 6/2017 | Nam | H01L 51/448 |
| 9,705,107 B2* | 7/2017 | Kim | H01L 51/5256 |
| 2002/0125822 A1* | 9/2002 | Graff | H01L 51/5256 313/506 |
| 2003/0085654 A1* | 5/2003 | Hayashi | H01L 51/529 313/506 |
| 2003/0164677 A1 | 9/2003 | Miyaguchi et al. | |
| 2003/0197197 A1* | 10/2003 | Brown | H01L 51/5246 257/200 |
| 2004/0056269 A1 | 3/2004 | Chen | |
| 2004/0232832 A1* | 11/2004 | Kubota | H01L 51/5256 313/512 |
| 2004/0239241 A1* | 12/2004 | Wittmann | H01L 51/0097 313/511 |
| 2005/0156513 A1* | 7/2005 | Sano | H01L 51/5256 313/504 |
| 2005/0181212 A1* | 8/2005 | Schaepkens | H01L 51/5256 428/411.1 |
| 2006/0220548 A1* | 10/2006 | Menda | H01L 51/5243 313/512 |
| 2008/0238301 A1* | 10/2008 | Shim | H05B 33/04 313/504 |
| 2009/0267487 A1* | 10/2009 | Kwack | H01L 51/5256 313/503 |
| 2011/0140163 A1* | 6/2011 | Oh | H01L 51/5256 257/100 |
| 2011/0140164 A1* | 6/2011 | Seo | H01L 51/5256 257/100 |
| 2012/0146492 A1* | 6/2012 | Ryu | H01L 51/5256 313/512 |
| 2013/0181602 A1* | 7/2013 | Kang | H01L 51/5256 313/504 |
| 2014/0048780 A1* | 2/2014 | Song | H01L 51/5253 257/40 |
| 2014/0138634 A1* | 5/2014 | Lee | H01L 27/00 257/40 |
| 2014/0138651 A1* | 5/2014 | Oh | H01L 51/5253 257/40 |
| 2014/0175397 A1* | 6/2014 | Lee | H01L 51/5253 257/40 |
| 2014/0217371 A1* | 8/2014 | Kim | H01L 51/5256 257/40 |
| 2014/0312363 A1* | 10/2014 | Ryu | H01L 51/5256 257/88 |
| 2014/0322527 A1* | 10/2014 | Cho | C23C 16/44 428/339 |
| 2015/0014636 A1* | 1/2015 | Kang | H01L 51/5253 257/40 |
| 2015/0021565 A1 | 1/2015 | Min et al. | |
| 2015/0060786 A1* | 3/2015 | Kwak | H01L 51/5253 257/40 |
| 2015/0091030 A1* | 4/2015 | Lee | H01L 27/3246 257/91 |
| 2015/0228927 A1* | 8/2015 | Kim | H01L 51/5203 257/40 |
| 2015/0249229 A1* | 9/2015 | Song | H01L 51/5253 257/40 |
| 2015/0380684 A1* | 12/2015 | Yan | H01L 51/56 257/40 |
| 2015/0380685 A1* | 12/2015 | Lee | H01L 51/5243 257/40 |
| 2016/0043347 A1* | 2/2016 | Sun | H01L 51/5259 257/40 |
| 2016/0049443 A1* | 2/2016 | Kim | H01L 51/0023 257/91 |
| 2016/0049614 A1* | 2/2016 | Gao | G02B 5/3033 257/40 |
| 2016/0095172 A1* | 3/2016 | Lee | C23C 16/401 313/504 |
| 2016/0137769 A1* | 5/2016 | Kwack | C07C 69/54 257/40 |
| 2016/0141551 A1* | 5/2016 | Seo | H01L 51/5253 257/40 |
| 2016/0149165 A1* | 5/2016 | Kim | H01L 51/5284 257/40 |
| 2016/0164031 A1* | 6/2016 | Pieper | C08J 7/045 257/13 |
| 2016/0190503 A1* | 6/2016 | Chang | H01L 51/5253 257/40 |
| 2016/0226024 A1* | 8/2016 | Park | H01L 51/5256 |
| 2016/0254490 A1* | 9/2016 | Ryu | H01L 51/5256 257/40 |
| 2016/0268540 A1* | 9/2016 | Kim | H01L 51/5246 |
| 2016/0306472 A1* | 10/2016 | Park | G06F 3/0412 |
| 2016/0322601 A1* | 11/2016 | Lee | H01L 51/5256 |
| 2016/0336542 A1* | 11/2016 | Chen | H01L 21/67167 |
| 2016/0351852 A1* | 12/2016 | Kim | H01L 51/5256 |
| 2017/0018737 A1* | 1/2017 | Kim | H01L 51/5256 |
| 2017/0025640 A1* | 1/2017 | Kim | H01L 51/5256 |
| 2017/0062537 A1* | 3/2017 | Kim | H01L 27/3248 |
| 2017/0069876 A1* | 3/2017 | Popp | H01L 51/448 |
| 2017/0092896 A1* | 3/2017 | Nakamura | H01L 51/5256 |
| 2017/0115438 A1* | 4/2017 | Choi | G02B 5/3016 |
| 2017/0141313 A1* | 5/2017 | Min | C23C 14/042 |
| 2017/0149017 A1* | 5/2017 | Lee | H01L 51/5256 |
| 2017/0186999 A1* | 6/2017 | Lee | H01L 27/323 |
| 2017/0250373 A1* | 8/2017 | Kamiya | H01L 51/5256 |

FOREIGN PATENT DOCUMENTS

| | | |
|---|---|---|
| JP | 4303591 | 7/2009 |
| JP | 2015-23023 | 2/2015 |
| WO | WO 03/028903 A2 | 4/2003 |

* cited by examiner

DISPLAY DEVICE

CROSS-REFERENCE TO RELATED APPLICATION

The present application claims priority from Japanese application JP2016-034588 filed on Feb. 25, 2016, the content of which is hereby incorporated by reference into this application.

BACKGROUND OF THE INVENTION

1. Field of the Invention

The present invention relates to a display device.

2. Description of the Related Art

Since a light emitting element layer such as an organic electroluminescence layer deteriorates by absorbing moisture, it is necessary to cover it with a sealing film to shut it off from an atmosphere. When SiN is used as a material for the sealing layer, the film thickness increases, and in the case of a flexible display, when it is bent, the sealing film possibly cracks. Further, according to some method of forming the film, SiN includes $H_2$, and thus if a thin film transistor is formed with a transparent amorphous oxide semiconductor (TAOS), a threshold voltage ($V_{th}$) gets shifted when a diffusion of $H_2$ reaches TAOS.

Japanese Unexamined Patent Publication No. 2015-023023 and Japanese Patent No. 4303591 disclose sealing films that include an Aluminum Oxide film, but the Aluminum Oxide film is sealed by another film. Japanese Unexamined Patent Publication No. 2000-223264 discloses a sealing film that includes an Aluminum Oxide film. Japanese Unexamined Patent Publication No. 2004-063462 discloses a sealing film for which a diamond like carbon is used. Regarding a display device, needs for narrowing down a width of a frame that surrounds a display region are increasing, but such needs are not considered in those patent documents.

SUMMARY OF THE INVENTION

It is an object of the present invention to form a sealing layer that accommodates itself to the narrowing of a frame, has increased flexibility, and prevents intrusion of moisture, and it is also an object of the present invention to stabilize a semiconductor property, that is, for example, to prevent the diffusion of $H_2$ to control a shift of threshold voltage of a thin film transistor formed with the transparent amorphous oxide semiconductor (TAOS).

A display device according to the present invention includes: a light emitting element including a light emitting layer, and a first electrode and a second electrode that hold the light emitting layer therebetween; and a sealing layer on the light emitting element, wherein the sealing layer includes an organic layer, and a first inorganic layer and a second inorganic layer that hold the organic layer from an upper side and a lower side, a peripheral part of the first inorganic layer and a peripheral part of the second inorganic layer are connected around an outer perimeter of the organic layer and vertically overlap with each other so as not to cover an edge surface of each other's from a lateral side, and at least one of the first inorganic layer and the second inorganic layer is an Aluminum Oxide film. According to the present invention, the peripheral part of the first inorganic layer and the peripheral part of the second inorganic layer do not cover the edge surface of each other's. Therefore, compared with the case where the peripheral part of one of these covers the edge surface of the peripheral part of the other's, a formation region of the sealing layer becomes small, and the device can accommodate itself to the narrowing of a frame. Further, since one layer in the sealing layer is an Aluminum Oxide film, it is possible to form the sealing layer that can be bent easily and contains no moisture.

DETAILED DESCRIPTION OF THE INVENTION

Embodiments of the present invention are illustrated with reference to the accompanying drawings as follows. Note that the present invention can be used in various modes which do not depart from the spirit of the present invention, and should not be interpreted within a description of exemplary embodiments illustrated below.

While the width, thickness, shape, and the like of each component in the drawings may be illustrated schematically as compared with the actual embodiments in order to clarify the explanation, these are merely examples and the interpretation of the present invention should not be limited thereto. Furthermore, in the specification or respective drawings, the same reference symbols may be applied to elements that have functions similar to those that have already been illustrated in another drawing and an explanation of such elements may be omitted as appropriate.

Further, in the detailed explanation of the present invention, when a positional relationship between one component and another component is defined, unless specified otherwise, the words "on" and "under" are not applied only to a case where the other component is located directly on or directly under the one component, but may also be applied to a case where still another component is interposed between the one component and the other component.

Figure 1:
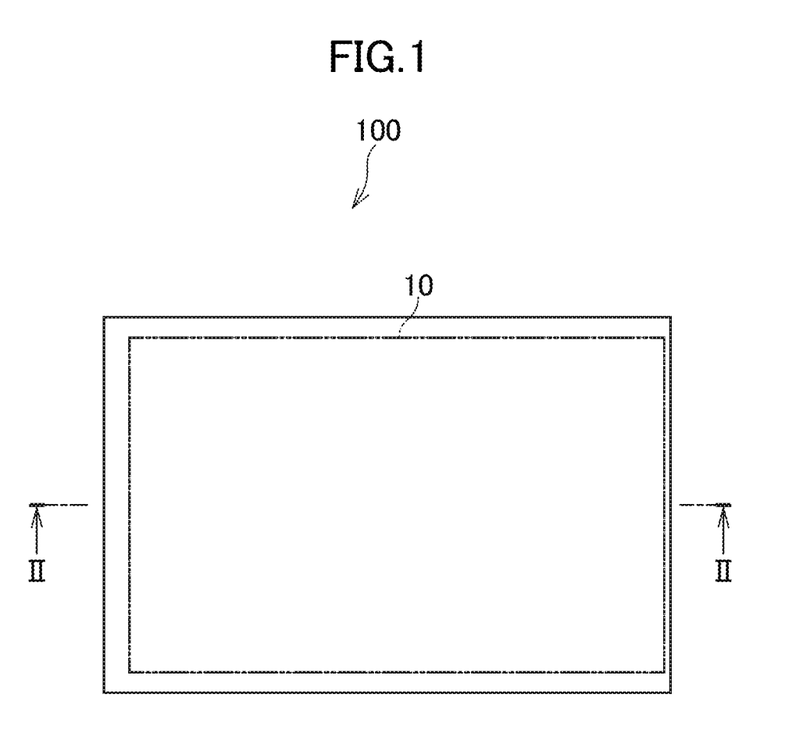
FIG. 1 illustrates a planar view of a display device according to an embodiment of the present invention.

FIG. 1 is a planer view of a display device according to an embodiment of the present invention. As a display device 100, an organic electroluminescence display device is mentioned as an example. The display device 100 is configured to combine unit pixels of a plurality of colors composed of, for example, red, green and blue (subpixels) to form a pixel of full color (a pixel) and display an image of full color in a display region 10.

Figure 2:
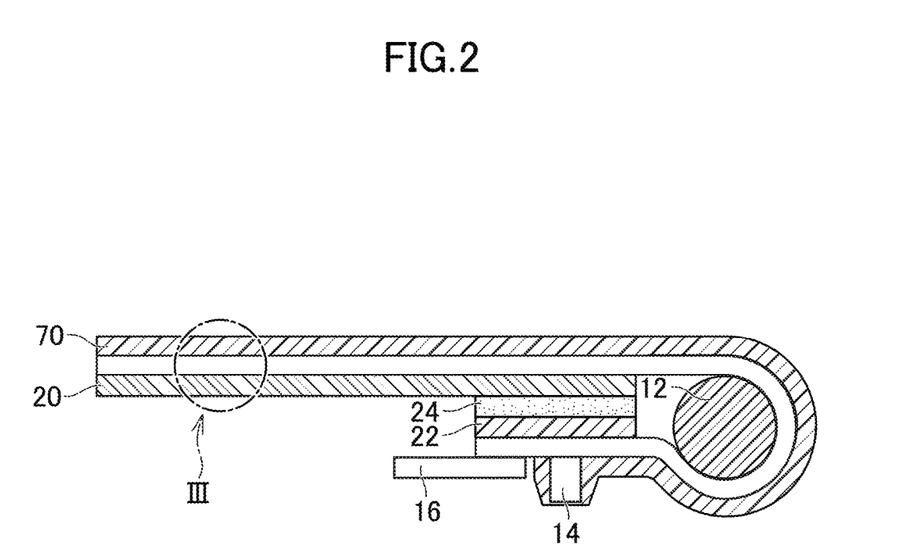
FIG. 2 illustrates a II-II line cross sectional view of a display device illustrated in FIG. 1.

FIG. 2 is a II-II line cross sectional view of the display device illustrated in FIG. 1. The display device 100 has a curved shape, and a spacer 12 is arranged inside the curvature. The spacer 12 works as a guide that restricts the curvature of the display device 100. An integrated circuit chip 14 is provided on the display device 100, and a flexible printed circuit (FPC) 16 is connected to the display device 100.

Figure 3:
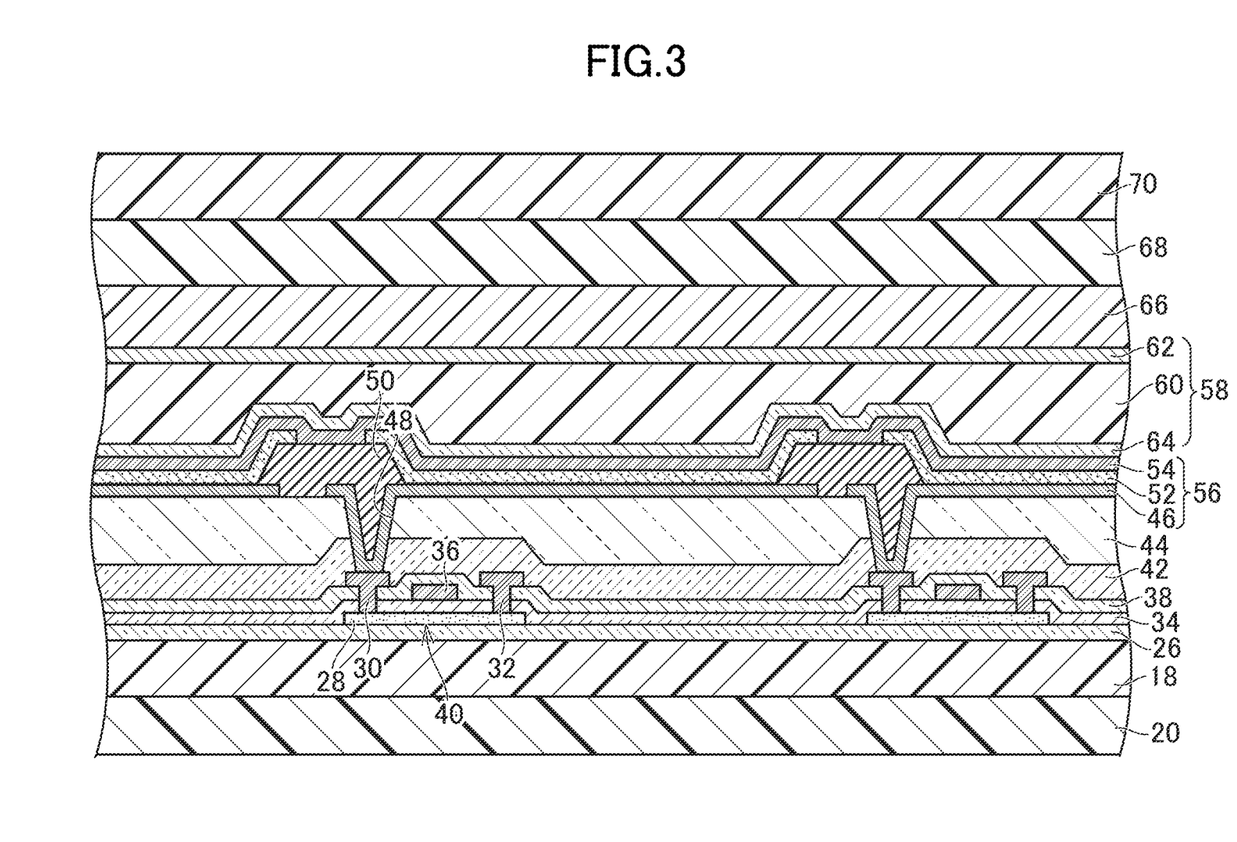
FIG. 3 illustrates a magnified view of part III encircled by a chain line in FIG. 2.

FIG. 3 is a magnified view of part III encircled by a chain line in FIG. 2. The display device 100 has a first substrate 18 made of a material having flexibility such as resin. The first substrate 18 is located inside the curvature illustrated in FIG. 2. Inside the curvature, at least on the backside of the display region 10 of the display device 100, a first reinforcing film 20 is attached to the first substrate 18. Further, as illustrated in FIG. 2, a second reinforcing film 22 is attached so as to be opposed to the first reinforcing film 20, and the first reinforcing film 20 and the second reinforcing film 22 are attached to each other via an adhesive 24 to thereby maintain the curved state of the display device 100.

As illustrated in FIG. 3, on the first substrate 18, an undercoat layer 26 is formed that becomes a barrier against impurities that are contained by the first substrate 18 itself, and a semiconductor layer 28 is formed thereon. A source electrode 30 and a drain electrode 32 are connected electrically to the semiconductor layer 28, and a gate insulation film 34 is formed so as to cover the semiconductor layer 28. A gate electrode 36 is formed on the gate insulation film 34, and an interlayer insulation film 38 is formed so as to cover the gate electrode 36. The source electrode 30 and the drain electrode 32 penetrate the gate insulation film 34 and the interlayer insulation film 38. A thin film transistor 40 is constituted by the semiconductor layer 28, the source electrode 30, the drain electrode 32 and the gate electrode 36. A passivation film 42 is provided so as to cover the thin film transistor 40.

A planarization layer 44 is provided on the passivation film 42. A plurality of pixel electrodes 46 (e.g. anodes) arranged to correspond to each of the plurality of unit pixels are provided on the planarization layer 44. The planarization layer 44 is formed so that at least a surface where the pixel electrode 46 is provided is planarized. The pixel electrode 46 is electrically connected to one of the source electrode 30 and the drain electrode 32 on the semiconductor layer 28 through a contact hole 48 that penetrates the planarization layer 44 and the passivation film 42.

An insulation layer 50 is formed on the planarization layer 44 and the pixel electrode 46. The insulation layer 50 is put on a peripheral part of the pixel electrode 46, and is configured to form an opening at a part (e.g. a central part) of the pixel electrode 46. A bank to surround the part of the pixel electrode 46 is formed by the insulation layer 50.

A light emitting layer 52 is provided on the pixel electrode layer 46. The light emitting layer 52 is provided individually (separately) for each pixel electrode 46, and is configured to be put also on the insulation layer 50. In this case, the light emitting layer 52 emits light in blue, red and green in correspondence with respective pixels. As a variation, the light emitting layer 52 may be configured to be located on the plurality of pixel electrodes 46 to form a continuous layer and made to emit light in white, and in such a case a color filter is provided.

On the light emitting layer 52, a common electrode (e.g. a cathode) is provided. The common electrode is formed to be put on the insulation layer 50 that constitutes the bank. A light emitting element 56 is constituted by the light emitting layer 52, and the pixel electrode 46 (the anode) and the common electrode (the cathode) that hold the light emitting layer 52 therebetween. The light emitting layer 52 is held between the pixel electrode 46 and the common electrode 54, and emits light with its luminance controlled by a current that runs therebetween. Between the light emitting layer 52 and the pixel electrode 46 (the anode), at least one of a hole injection layer and a hole transport layer (not shown) may be provided. Between the light emitting layer 52 and the common electrode 54 (the cathode), at least one of an electron injection layer and an electron transport layer (not shown) may be provided.

The light emitting element 56 is covered by a sealing layer 58 laminated on the common electrode 54 to be sealed and is shut off from moisture. The sealing layer 58 includes an organic layer 60, and a first inorganic layer 62 and a second inorganic layer 64 that hold the organic layer 60 from an upper side and a lower side. Both of the first inorganic layer 62 and the second inorganic layer 64 are Aluminum Oxide films. The thickness of the Aluminum Oxide films is in the range of 25 nm to 100 nm, and is preferably around 25 nm, in particular. Since at least one layer in the sealing layer 58 is an Aluminum Oxide film, the sealing layer 58 can be bent easily and is configured to contain no moisture.

Figure 4:
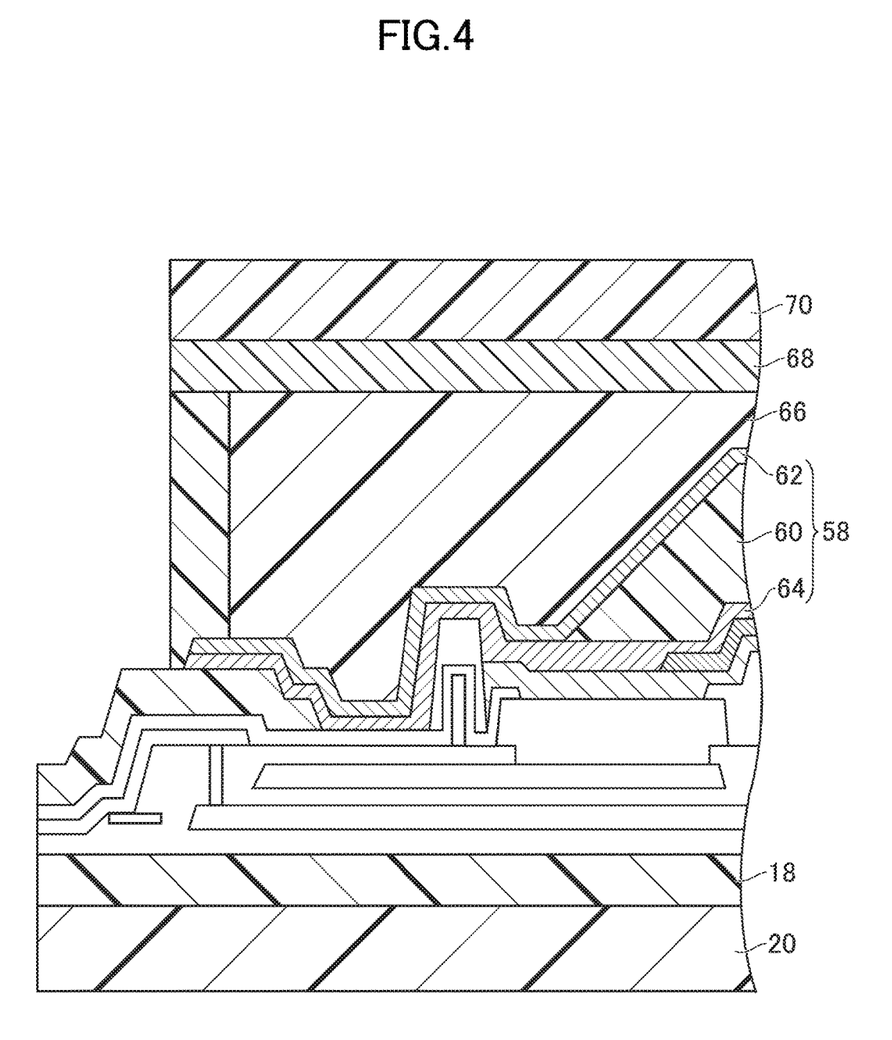
FIG. 4 illustrates a cross sectional view of an edge part of a display device illustrated in FIG. 2.

FIG. 4 is a cross sectional view of an edge part of the display device illustrated in FIG. 2. A peripheral part of the first inorganic layer 62 and a peripheral part of the second inorganic layer 64 vertically overlap with each other so as to seal the organic layer 60 at its outer perimeter. The peripheral part of the first inorganic layer 62 and the peripheral part of the second inorganic layer 64 do not cover an edge surface of each other's from a lateral side. That is, a tip of one of the first inorganic layer 62 and the second inorganic layer 64 is not located farther than the peripheral part of the other's. Therefore, compared with the case where the peripheral part of one of these covers an edge surface of the peripheral part of the other's, a formation region of the sealing layer 58 becomes small, and the device can accommodate itself to the narrowing of a frame.

To the sealing layer 58, a second substrate 68 made of a material having flexibility such as resin is attached with an intervention of an adhesive layer 66. On the front side of the curvature of the display device 100, a third reinforcing film 70 is attached to the second substrate 68 (see FIG. 2).

Figure 5:
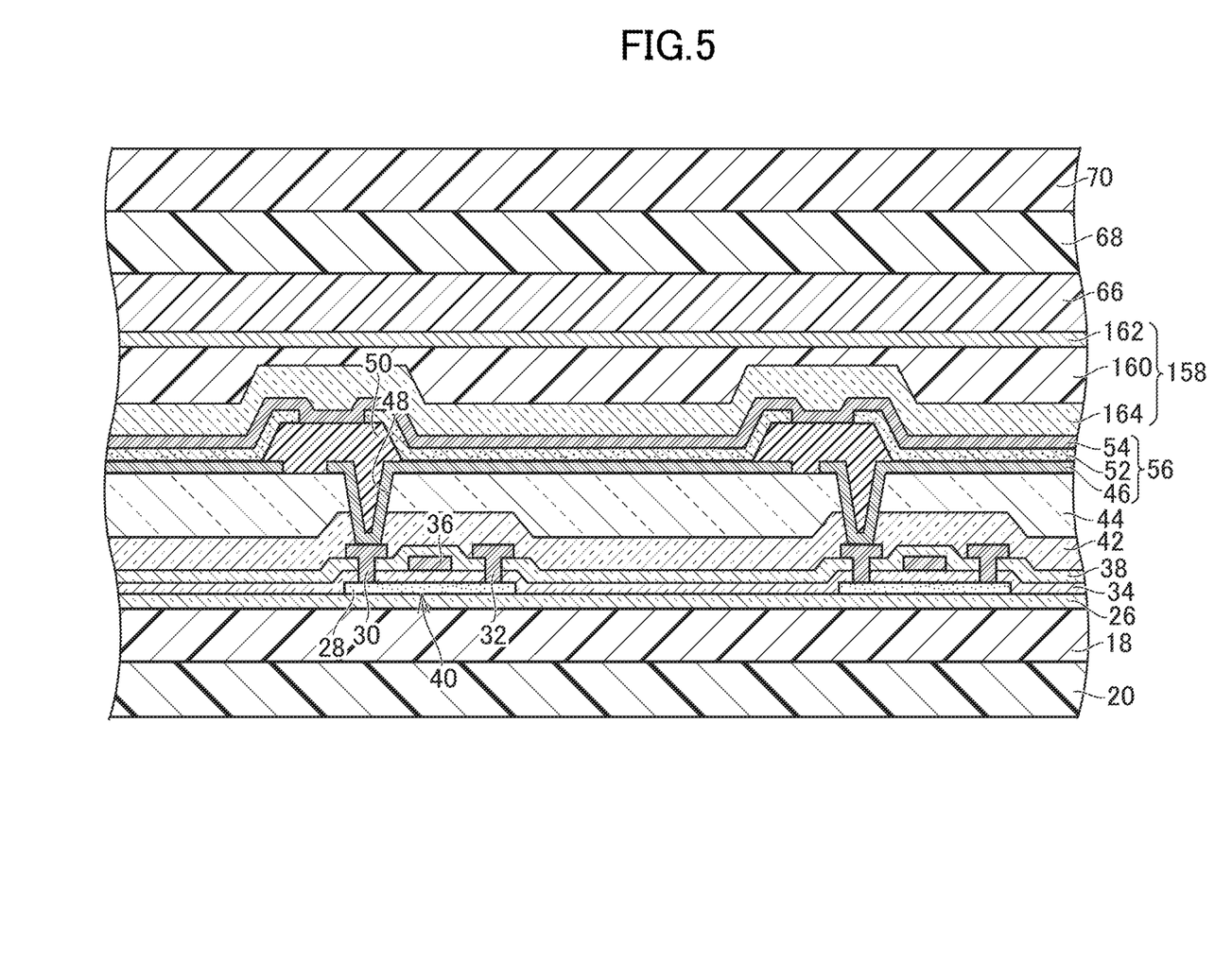
FIG. 5 illustrates a cross sectional view of a display device according to a first variation of the embodiment.

FIG. 5 is a cross sectional view of a display device according to a first variation of the embodiment. This example is the same with the above embodiment in that a first inorganic layer 162 is the Aluminum Oxide film. A second inorganic layer 164 is a Silicon Nitride film. A thickness of the Silicon Nitride film is around 1 μm. A sealing layer 158 includes an organic layer 160, and the first inorganic layer 162 and the second inorganic layer 164 that hold the organic layer 160 from an upper side and a lower side.

Figure 6:
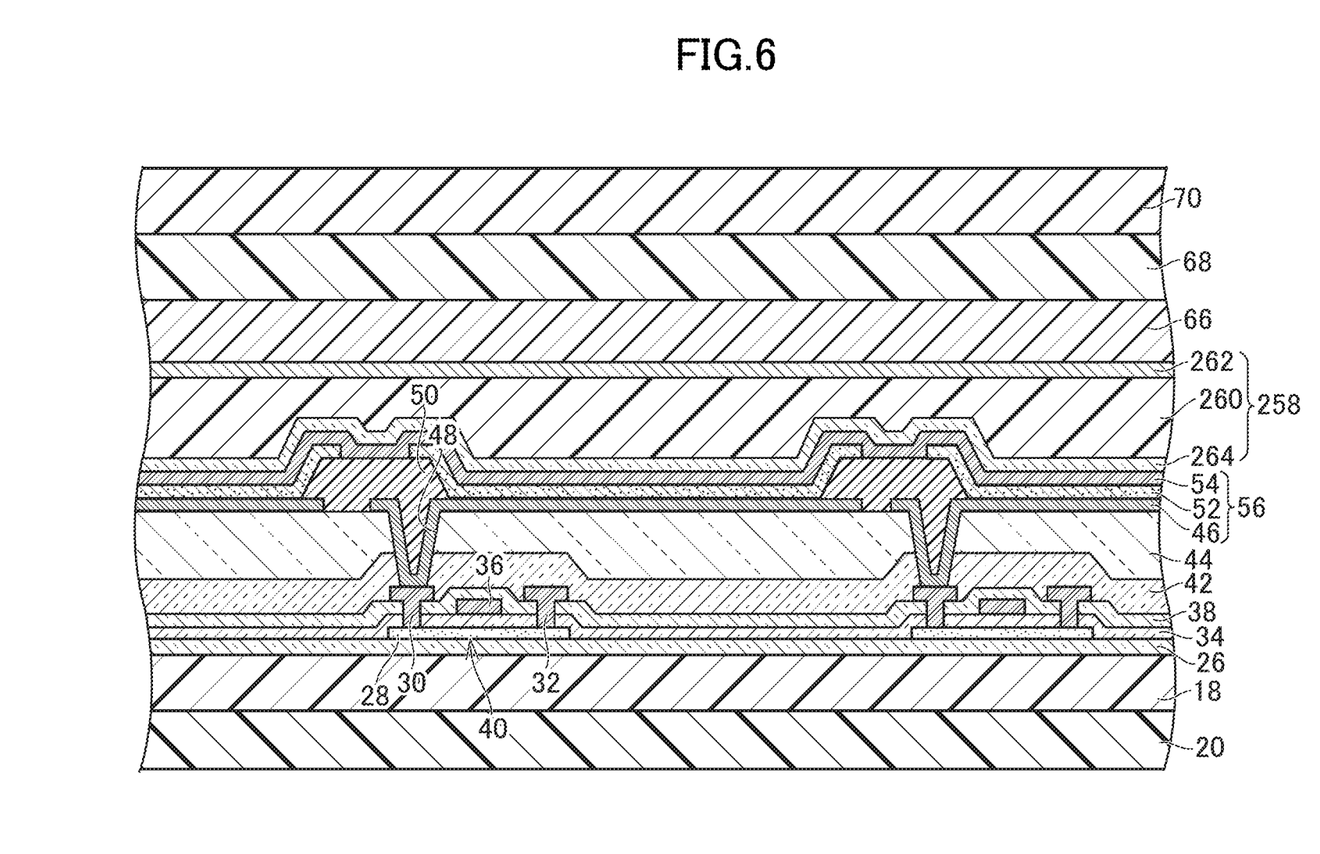
FIG. 6 illustrates a cross sectional view of a display device according to a second variation of the embodiment.

FIG. 6 is a cross sectional view of a display device according to a second variation of the embodiment. This example is the same with the above embodiment in that a second inorganic layer 264 is the Aluminum Oxide film. A first inorganic layer 262 is a Silicon Nitride film. A thickness of the Silicon Nitride film is around 1 μm. A sealing layer 258 includes an organic layer 260, and the first inorganic layer 262 and the second inorganic layer 264 that hold the organic layer 260 from an upper side and a lower side.

The display device 100 is not limited to be an organic electroluminescence display device, and may be a display device that is provided with a light emitting element such as a quantum-dot light emitting diode (QLED) for each pixel or may be a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a substrate
a light emitting element on the substrate, the light emitting element including a light emitting layer, a first electrode, and a second electrode, the first electrode and the second electrode holding the light emitting layer therebetween; and
a sealing layer on the light emitting element,
wherein the sealing layer comprises an organic layer, a first inorganic layer, and a second inorganic layer, the first inorganic layer and the second inorganic layer holding the organic layer from an upper side and a lower side,
the first inorganic layer and the second inorganic layer include respective peripheral parts connected to each other around an outer perimeter of the organic layer and vertically overlap with each other so as not to cover an edge surface of each other's from a lateral side,
the peripheral parts include a first area outside and adjacent to the outer perimeter of the organic layer, the first area including a point where the first and second inorganic layers contact each other, a second area outer from the point in the first area toward a peripheral edge of the display device, and a third area outer from the second area toward the peripheral edge of the display device,
the second area is higher than the first area,
the third area is lower than the second area, and
at least one of the first inorganic layer and the second inorganic layer is an Aluminum Oxide film.

2. The display device according to claim 1,
wherein one of the first inorganic layer and the second inorganic layer is an Aluminum Oxide film, and
the other one of the first inorganic layer and the second inorganic layer is a Silicon Nitride film.

3. The display device according to claim 1,
wherein the display device is configured to bend at a portion which includes the first inorganic layer and the second inorganic layer.

4. The display device according to claim 3,
wherein one of the first inorganic layer and the second inorganic layer is an Aluminum Oxide film, and
the other one of the first inorganic layer and the second inorganic layer is a silicon nitride film.

5. The display device according to claim 1,
wherein the third area is a recessed area, and
the second area is a raised area.

6. The display device according to claim 1,
wherein a first distance between the first inorganic layer at the first area and the substrate is shorter than a second distance between the first inorganic layer at the second area and the substrate.

7. The display device according to claim 6,
wherein the first distance is longer than a third distance between the first inorganic layer at the third area and the substrate.

8. The display device according to claim 6,
wherein a fourth distance between the second inorganic layer at the first area and the substrate is shorter than a fifth distance between the second inorganic layer at the second area and the substrate.

9. The display device according to claim 8,
wherein the fourth distance is longer than a sixth distance between the second inorganic layer at the third area and the substrate.

10. The display device according to claim 1,
wherein thickness of the Aluminum Oxide film is from 25 nm to 100 nm.

11. A display device comprising:
a substrate;
a light emitting element on the substrate, the light emitting element including a light emitting layer, a first electrode, and a second electrode, the first electrode and the second electrode holding the light emitting layer therebetween; and
a sealing layer on the light emitting element,
wherein the sealing layer comprises an organic layer, a first inorganic layer, and a second inorganic layer, the first inorganic layer and the second inorganic layer holding the organic layer from an upper side and a lower side,
the first inorganic layer and the second inorganic layer include respective peripheral parts connected to each other around an outer perimeter of the organic layer and vertically overlap with each other so as not to cover an edge surface of each other's from a lateral side,
the peripheral parts include a first area outside and adjacent to the outer perimeter of the organic layer, the first area including a point where the first and second inorganic layers contact each other, a second area outer from the point in the first area toward a peripheral edge of the display device, and a third area outer from the second area toward the peripheral edge of the display device toward a peripheral edge of the display device,
the second area is higher than the first area,
the third area is lower than the second area,
the display device is configured to bend at a portion which includes the first inorganic layer and the second inorganic layer, the portion having a shape of a curve,
the first inorganic layer is an Aluminum Oxide film, and
the first inorganic layer is closer to an inside of the curve than the second inorganic layer at the portion.

12. The display device according to claim 11,
wherein the second inorganic layer is a Silicon Nitride film.

13. The display device according to claim 11,
wherein the third area is a recessed area, and
the second area is a raised area.

14. The display device according to claim 11,
wherein a first distance between the first inorganic layer at the first area and the substrate is shorter than a second distance between the first inorganic layer at the second area and the substrate.

15. The display device according to claim 14,
wherein the first distance is longer than a third distance between the first inorganic layer at the third area and the substrate.

16. The display device according to claim 14,
wherein a fourth distance between the second inorganic layer at the first area and the substrate is shorter than a fifth distance between the second inorganic layer at the second area and the substrate.

17. The display device according to claim 16,
wherein the fourth distance is longer than a sixth distance between the second inorganic layer at the third area and the substrate.

18. The display device according to claim 11, wherein thickness of the Aluminum Oxide film is from 25 nm to 100 nm.

* * * * *